US010008644B2

United States Patent
Masuda et al.

(10) Patent No.: US 10,008,644 B2
(45) Date of Patent: Jun. 26, 2018

(54) LIGHT EMITTING DEVICE AND FABRICATING METHOD THEREOF

(71) Applicant: Sharp Kabushiki Kaisha, Sakai (JP)

(72) Inventors: Masatsugu Masuda, Sakai (JP); Masaaki Katoh, Sakai (JP); Tsukasa Inoguchi, Sakai (JP)

(73) Assignee: Sharp Kabushiki Kaisha, Sakai (JP)

( * ) Notice: Subject to any disclaimer, the term of this patent is extended or adjusted under 35 U.S.C. 154(b) by 5 days.

(21) Appl. No.: 15/630,286

(22) Filed: Jun. 22, 2017

(65) Prior Publication Data

US 2017/0283694 A1 Oct. 5, 2017

Related U.S. Application Data

(63) Continuation of application No. 15/008,020, filed on Jan. 27, 2016, now Pat. No. 9,722,149, which is a (Continued)

(30) Foreign Application Priority Data

| May 30, 2005 | (JP) | 2005-157056 |
| Jul. 12, 2005 | (JP) | 2005-202851 |
| Mar. 6, 2006 | (JP) | 2006-059689 |

(51) Int. Cl.
*H01L 33/50* (2010.01)
*C09K 11/08* (2006.01)
(Continued)

(52) U.S. Cl.
CPC ........ *H01L 33/504* (2013.01); *C09K 11/0883* (2013.01); *C09K 11/7721* (2013.01);
(Continued)

(58) Field of Classification Search
CPC ........................................ H01L 33/50–33/508
See application file for complete search history.

(56) References Cited

U.S. PATENT DOCUMENTS

| 3,707,641 A | 12/1972 | Thornton |
| 4,216,408 A | 8/1980 | Verstegen et al. |

(Continued)

FOREIGN PATENT DOCUMENTS

| CN | 1129727 | 8/1996 |
| CN | 1289455 | 3/2001 |

(Continued)

OTHER PUBLICATIONS

Hirosaki, N. et al. (2005). "Characterization and Properties of Green-Emitting B-SiAlON:Eu2+ Powder Phosphors for White Light-Emitting Diodes," Applied Physics Letters. 86:211905-1-211905-3.

(Continued)

*Primary Examiner* — Mariceli Santiago
(74) *Attorney, Agent, or Firm* — Morrison & Foerster LLP

(57) ABSTRACT

A light-emitting device includes a light-emitting element for emitting primary light, and a wavelength conversion unit for absorbing part of the primary light and emitting secondary light having a wavelength longer than that of the primary light, wherein the wavelength conversion unit includes plural kinds of phosphors having light absorption characteristics different from each other, and then at least one kind of phosphor among the plural kinds of phosphors has an absorption characteristic that can absorb the secondary light emitted from at least another kind of phosphor among the plural kinds of phosphors.

2 Claims, 5 Drawing Sheets

Related U.S. Application Data continuation of application No. 14/254,619, filed on Apr. 16, 2014, now Pat. No. 9,281,456, which is a continuation of application No. 12/774,495, filed on May 5, 2010, now Pat. No. 8,729,788, which is a continuation of application No. 11/442,000, filed on May 26, 2006, now Pat. No. 7,737,621.

(51) Int. Cl.
  C09K 11/77 (2006.01)
  H01J 1/63 (2006.01)
(52) U.S. Cl.
  CPC ...... C09K 11/7728 (2013.01); C09K 11/7734 (2013.01); C09K 11/7739 (2013.01); C09K 11/7774 (2013.01); H01J 1/63 (2013.01); H01L 33/505 (2013.01); H01L 33/508 (2013.01); H01L 2224/32245 (2013.01); H01L 2224/45144 (2013.01); H01L 2224/48091 (2013.01); H01L 2224/48247 (2013.01); H01L 2224/73265 (2013.01); H01L 2933/0041 (2013.01)

(56) References Cited

U.S. PATENT DOCUMENTS

| | | |
|---|---|---|
| 4,390,637 A | 6/1983 | Daiku |
| 5,611,959 A | 3/1997 | Kijima et al. |
| 5,684,359 A | 11/1997 | Yano et al. |
| 6,096,243 A | 8/2000 | Oshio et al. |
| 6,340,824 B1 | 1/2002 | Komoto et al. |
| 6,565,771 B1 | 5/2003 | Ono et al. |
| 6,576,157 B2 | 6/2003 | Ono et al. |
| 6,632,379 B2 | 10/2003 | Mitomo et al. |
| 6,635,363 B1 | 10/2003 | Duclos et al. |
| 6,680,004 B2 | 1/2004 | Ono et al. |
| 6,686,691 B1 | 2/2004 | Mueller et al. |
| 6,717,353 B1 | 4/2004 | Mueller et al. |
| 6,812,500 B2 | 11/2004 | Reeh et al. |
| 7,026,755 B2 | 4/2006 | Setlur et al. |
| 7,026,756 B2 | 4/2006 | Shimizu et al. |
| 7,077,978 B2 | 7/2006 | Setlur et al. |
| 7,176,623 B2 | 2/2007 | Nitta et al. |
| 7,265,488 B2 | 9/2007 | Ng et al. |
| 7,345,317 B2 | 3/2008 | Reeh et al. |
| 7,453,195 B2 | 11/2008 | Radkov |
| 7,737,621 B2 | 6/2010 | Masuda et al. |
| 7,808,012 B2 | 10/2010 | Masuda et al. |
| 7,833,436 B2 | 11/2010 | Shimooka et al. |
| 2002/0063301 A1 | 5/2002 | Hanamoto et al. |
| 2002/0079506 A1 | 6/2002 | Komoto et al. |
| 2002/0088985 A1 | 7/2002 | Komoto et al. |
| 2003/0030368 A1 | 2/2003 | Ellens et al. |
| 2003/0052595 A1 | 3/2003 | Ellens et al. |
| 2003/0080341 A1 | 5/2003 | Sakano et al. |
| 2003/0218180 A1 | 11/2003 | Fujiwara |
| 2004/0056256 A1 | 3/2004 | Bokor et al. |
| 2004/0095063 A1 | 5/2004 | Murazaki et al. |
| 2004/0207313 A1 | 10/2004 | Omoto et al. |
| 2004/0245532 A1 | 12/2004 | Maeda et al. |
| 2004/0251809 A1 | 12/2004 | Shimomura et al. |
| 2005/0001225 A1 | 1/2005 | Yoshimura et al. |
| 2005/0001533 A1 | 1/2005 | Huber et al. |
| 2005/0062417 A1 | 3/2005 | Okuyama et al. |
| 2005/0093442 A1 | 5/2005 | Setlur et al. |
| 2005/0156496 A1 | 7/2005 | Takashima et al. |
| 2005/0189863 A1 | 9/2005 | Nagatomi et al. |
| 2005/0212397 A1 | 9/2005 | Murazaki et al. |
| 2006/0038477 A1 | 2/2006 | Tamaki et al. |
| 2006/0045832 A1 | 3/2006 | Nagatomi et al. |
| 2006/0076569 A1 | 4/2006 | Otsuka et al. |
| 2006/0198418 A1 | 9/2006 | Hama et al. |
| 2006/0208262 A1 | 9/2006 | Sakuma et al. |
| 2006/0226759 A1 | 10/2006 | Masuda et al. |
| 2006/0244358 A1 | 11/2006 | Kim et al. |
| 2007/0007494 A1 | 1/2007 | Hirosaki et al. |
| 2007/0029565 A1 | 2/2007 | Masuda et al. |
| 2007/0052342 A1 | 3/2007 | Masuda et al. |
| 2007/0054065 A1 | 3/2007 | Shutou |
| 2007/0257596 A1 | 11/2007 | Shimomura et al. |
| 2007/0259206 A1 | 11/2007 | Oshio |
| 2008/0093979 A1 | 4/2008 | Bechtel et al. |
| 2008/0106186 A1 | 5/2008 | Ishii et al. |
| 2008/0191620 A1 | 8/2008 | Moriyama et al. |
| 2008/0258602 A1 | 10/2008 | Masuda et al. |
| 2009/0014741 A1 | 1/2009 | Masuda et al. |
| 2009/0021141 A1 | 1/2009 | Emoto et al. |
| 2009/0267484 A1 | 10/2009 | Kasakura et al. |
| 2011/0019707 A1 | 1/2011 | Sato et al. |
| 2012/0305844 A1 | 2/2012 | Emoto et al. |

FOREIGN PATENT DOCUMENTS

| | | |
|---|---|---|
| CN | 1591744 | 3/2005 |
| EP | 0 418 902 | 3/1991 |
| EP | 1 433 831 | 6/2004 |
| EP | 1 568 753 | 8/2005 |
| EP | 1 806 390 | 7/2007 |
| JP | 49-077893 | 7/1974 |
| JP | 03-106988 | 5/1991 |
| JP | 10-228868 | 8/1998 |
| JP | 10-242513 | 9/1998 |
| JP | 10-277796 | 10/1998 |
| JP | 11-87770 | 3/1999 |
| JP | 2000-31531 | 1/2000 |
| JP | 2000-31532 | 1/2000 |
| JP | 2000-109826 | 4/2000 |
| JP | 2001-26407 | 1/2001 |
| JP | 2001-127346 | 5/2001 |
| JP | 2001-172623 | 6/2001 |
| JP | 2002-003836 | 1/2002 |
| JP | 2002-003837 | 1/2002 |
| JP | 2002-060747 | 2/2002 |
| JP | 2002-171000 | 6/2002 |
| JP | 2002-249766 | 9/2002 |
| JP | 2002-275462 | 9/2002 |
| JP | 2002-363554 | 12/2002 |
| JP | 2003-64358 | 3/2003 |
| JP | 2003-110150 | 4/2003 |
| JP | 2003-121838 | 4/2003 |
| JP | 2003-124527 | 4/2003 |
| JP | 2003-249694 | 9/2003 |
| JP | 2003-321675 | 11/2003 |
| JP | 2003-347588 | 12/2003 |
| JP | 2004-55632 | 2/2004 |
| JP | 2004-071357 | 3/2004 |
| JP | 2004-155907 | 6/2004 |
| JP | 2004-161806 | 6/2004 |
| JP | 2004-161871 | 6/2004 |
| JP | 2004-161982 | 6/2004 |
| JP | 2004-179644 | 6/2004 |
| JP | 2004-182780 | 7/2004 |
| JP | 2004-186278 | 7/2004 |
| JP | 2004-210921 | 7/2004 |
| JP | 2004-287323 | 10/2004 |
| JP | 2004-327492 | 11/2004 |
| JP | 2005-93896 | 4/2005 |
| JP | 2005-109085 | 4/2005 |
| JP | 2005-239985 | 9/2005 |
| JP | 2005-244075 | 9/2005 |
| JP | 2005-244226 | 9/2005 |
| JP | 2005-255895 | 9/2005 |
| JP | 2005-272486 | 10/2005 |
| JP | 2005-277127 | 10/2005 |
| JP | 2005-298805 | 10/2005 |
| JP | 2006-16413 | 1/2006 |
| JP | 2006-49799 | 2/2006 |
| JP | 2006-63233 | 3/2006 |
| JP | 2006-80443 | 3/2006 |
| JP | 2006-89547 | 4/2006 |
| JP | 2006-173498 | 6/2006 |
| JP | 2006-261512 | 9/2006 |
| JP | 2006-303373 | 11/2006 |

(56) References Cited

FOREIGN PATENT DOCUMENTS

| | | |
|---|---|---|
| JP | 2006-332269 | 12/2006 |
| JP | 2007-7045 | 1/2007 |
| JP | 2007-049114 | 2/2007 |
| JP | 2007-180483 | 7/2007 |
| JP | 2007-191680 | 8/2007 |
| JP | 2009-94199 | 4/2009 |
| JP | 2010-199400 | 9/2010 |
| WO | WO-00/33389 | 6/2000 |
| WO | WO-01/24229 | 4/2001 |
| WO | WO-02/059982 | 8/2002 |
| WO | WO-2005/044947 | 5/2005 |
| WO | WO-2005/067068 | 7/2005 |
| WO | WO-2005/052087 | 9/2005 |
| WO | WO-2005/091387 | 9/2005 |
| WO | WO-2006/041168 | 4/2006 |
| WO | WO-2006/068141 | 6/2006 |
| WO | WO-2006/093135 | 9/2006 |

OTHER PUBLICATIONS

Shimomura, Y. et al., Extended Abstracts (2004). "Luminescent Properties of Green Phosphor Ca3Sc2Si3O12:Ce." Extended Abstracts. Proceedings of the 65th Annual Meeting for the Japan Society of Applied Physics. 2004.9, Tohoku Gakuin University.
Uheda, K. et al., (Feb. 15, 2006) "Luminescence Properties of a Red Phosphor, CaAlSiN3:Eu2+, for White Light Emitting Diodes", Electrochemical and Solid State Letters, 9(4) H22-H25.
Uheda, K. et al. (Sep. 1, 2004). Luminescent Properties of a Red Phosphor (CaAlSiN3:Eu2+). Proceeding of JSAP Academic Meetings, Japan Society of Applied Physics. 1,6(3):1283; 2 pages.
Uheda, et al. (2004). "Red Phosphors for Warm White Light-emitting diodes," Phosphor Research Society, The 305th Meeting TechSB/08cal Digest; pp. 37-47 (English Translation of Relevant Portions).
Uheda et al. (2006). "Host lattice materials in the system Ca3N2—AlN—Si3N4 for white light emitting diode", phys. sta. sol. (a). 203(11):2712-2717.
Xie, et al. (2004). "Eu2+-doped-Ca-α-SiAlON: a yellow phosphor for white light-emitting diodes", Applied Physics Letters. 84(26):5404-5406.
Ziegler et al. (2008). "Silica-Coated InP/ZnS Nanocrystals as Converter Material in White LEDs," *Advanced Materials* 20:1-6.
Masuda et al., U.S. Office Action dated Oct. 16, 2008, directed to U.S. Appl. No. 11/497,663; 11 pages.
Masuda et al., U.S. Office Action dated Feb. 5, 2009, directed to U.S. Appl. No. 11/442,000; 9 pages.
Masuda et al., U.S. Office Action dated Aug. 5, 2009, directed to U.S. Appl. No. 11/442,000; 14 pages.
Masuda et al., U.S. Office Action dated Oct. 2, 2009, directed to U.S. Appl. No. 11/442,000; 14 pages.
Masuda et al., U.S. Office Action dated May 27, 2009, directed to U.S. Appl. No. 11/497,663; 12 pages.
Masuda et al., U.S. Office Action dated Oct. 21, 2009, directed to U.S. Appl. No. 11/497,663; 13 pages.
Masuda et al., U.S. Office Action dated Jan. 28, 2009, directed to U.S. Appl. No. 11/515,512; 32 pages.
Masuda et al., U.S. Office Action dated Jul. 7, 2009, directed to U.S. Appl. No. 11/515,512; 19 pages.
Masuda et al., U.S. Office Action dated Feb. 17, 2010, directed to U.S. Appl. No. 11/515,512; 21 pages.
Masuda, M. et al., U.S. Office Action dated Mar. 12, 2010, directed to U.S. Appl. No. 11/497,663; 12 pages.
Masuda et al., U.S. Office Action dated Mar. 17, 2010, directed to U.S. Appl. No. 12/171,946; 7 pages.
Masuda et al., U.S. Office Action dated Jul. 2, 2010, directed to related U.S. Appl. No. 11/515,512; 22 pages.
Masuda et al., U.S. Office Action dated Nov. 15, 2010, directed to U.S. Appl. No. 11/944,052; 12 pages.
Masuda et al., U.S. Office Action dated Nov. 24, 2010, directed to U.S. Appl. No. 11/515,512; 23 pages.
Masuda et al., U.S. Advisory Action dated Mar. 16, 2011, directed to U.S. Appl. No. 11/515,512; 5 pages.
Masuda et al., U.S. Office Action dated Apr. 28, 2011, directed to U.S. Appl. No. 11/944,052; 8 pages.
Masuda et al., U.S. Office Action dated May 6, 2011, directed to U.S. Appl. No. 11/515,512; 19 pages.
Matsuda et al., U.S. Office Action dated Jul. 22, 2011, directed to U.S. Appl. No. 12/774,495; 21 pages.
Masuda et al., U.S. Office Action dated Aug. 9, 2011, directed to U.S. Appl. No. 11/944,052; 3 pages.
Masuda, M. et al. U.S. Office Action dated Oct. 21, 2011, directed to U.S. Appl. No. 11/515,512; 42 pages.
Matsuda et al., U.S. Office Action dated Jan. 30, 2012, directed to U.S. Appl. No. 12/774,495; 15 pages.
Masuda et al., U.S. Office Action dated Feb. 22, 2012, directed to U.S. Appl. No. 11/515,512; 35 pages.
Annen et al., U.S. Office Action dated Feb. 1, 2013, directed to U.S. Appl. No. 13/198,432; 12 pages.
Masuda et al., U.S. Office Action dated Apr. 5, 2013, directed to U.S. Appl. No. 11/944,052; 26 pages.
Matsuda et al., U.S. Office Action dated Jun. 26, 2013, directed to U.S. Appl. No. 12/774,495; 11 pages.
Masuda et al., U.S. Office Action dated Oct. 7, 2016, directed to U.S. Appl. No. 15/008,020; 7 pages.
Masuda et al., U.S. Notice of Allowance dated Mar. 27, 2017, directed to U.S. Appl. No. 15/008,020, 7 pages.
Matsuda et al., U.S. Office Action dated Sep. 23, 2013, directed to U.S. Appl. No. 12/774,495; 11 pages.
Masuda et al., Notice of Allowance dated Oct. 17, 2013, directed to U.S. Appl. No. 11/944,052; 11 pages.
Masuda et al., Notice of Allowance dated Jan. 6, 2014, directed to U.S. Appl. No. 12/774,495; 8 pages.
Masuda et al., U.S. Office Action dated Apr. 9, 2015, directed to U.S. Appl. No. 14/166,231; 9 pages.
Masuda et al., U.S. Office Action dated Oct. 2, 2015, directed to U.S. Appl. No. 14/166,231; 9 pages.
Masuda et al., U.S. Office Action dated Aug. 14, 2015, directed to U.S. Appl. No. 14/254,619, 7 pages.
Masuda et al.,Notice of Allowance dated Aug. 14, 2015, directed to U.S. Appl. No. 14/254,619, 10 pages.

LIGHT EMITTING DEVICE AND FABRICATING METHOD THEREOF

This application is a continuation of U.S. patent application Ser. No. 15/008,020, filed Jan. 27, 2016, which is a continuation of U.S. patent application Ser. No. 14/254,619, filed Apr. 16, 2014, now U.S. Pat. No. 9,281,456, issued on Mar. 8, 2016, which is a continuation of U.S. patent application Ser. No. 12/774,495, filed May 5, 2010, now U.S. Pat. No. 8,729,788, issued on May 20, 2014, which is a continuation of U.S. patent application Ser. No. 11/442,000, filed May 26, 2006, now U.S. Pat. No. 7,737,621, issued on Jun. 15, 2010, which is based on and claims the priority of Japanese Patent Applications Nos. 2005-157056, 2005-202851 and 2006-059689 filed with the Japan Patent Office on May 30, 2005, Jul. 12, 2005 and Mar. 6, 2006, respectively, the entire contents of which are hereby incorporated by reference.

BACKGROUND OF THE INVENTION

Field of the Invention

The present invention relates to improvement in a light-emitting device or a white light-emitting device including a semiconductor light-emitting element for emitting primary light and a wavelength conversion unit containing phosphor for absorbing the primary light and then emitting secondary light.

Description of the Background Art

The light-emitting device or the white light-emitting device including the semiconductor light-emitting element and the wavelength conversion unit has attracted attention as a light-emitting device or a white light-emitting device of next generation expected to realize low power consumption, downsizing, high luminance, and wide range of color reproducibility, for which research and development have been conducted vigorously.

A GaN-based light-emitting element, a ZnO-based light-emitting element, or the like is used as the semiconductor light-emitting element. Light having a wavelength in the range from the longer-wavelength side of ultraviolet to blue (i.e., about 380 nm to about 480 nm) is used as the primary light emitted from the light-emitting element. The wavelength conversion units have been proposed, which use various kinds of phosphors suitable for converting the primary light to the secondary light.

An example for the light-emitting device having such a wavelength conversion function is disclosed in Japanese Patent Laying-Open No. 2004-071357. This document describes use of InN-based nano-crystals as phosphor but gives no detailed explanation for light emission characteristics thereof. Japanese Patent Laying-Open No. 2004-179644 discloses a light-emitting device taking account of light diffusion efficiency in each of plural phosphor layers that include light diffusing agents added in resin. In this document as well, there is no detailed explanation for light emission characteristics of the phosphor layers.

Meanwhile, in the field of application of the white light-emitting device, its use as a white lighting device for a backlight in a liquid crystal display (LCD) (especially in a liquid crystal television (TV) set) or for a flashlight for a camera is most important. The white lighting device is required to have high luminous efficiency and, at the same time, good color reproducibility. Particularly, it is preferable that the white lighting device is able to give white light analogous to blackbody radiation that is colorless.

Japanese Patent Laying-Open Nos. 2004-071357 and 2004-179644 give no detailed explanation for light emission characteristics regarding plural kinds of phosphors included in the light-emitting device and no technical consideration for effect of relative arrangement order of the plural kinds of phosphors.

From the standpoint of preventing the resin layers containing the phosphors from being deteriorated by ultraviolet light during the operating period of the light-emitting device, in the case of using a light-emitting element having an emission peak wavelength in the range of 400 nm to 500 nm corresponding to the wavelength range of blue, the excitation characteristics in the visible light range in the wavelength conversion unit (i.e., in the plural kinds of phosphors contained therein) suitable for the wavelength of the primary light have the critical meaning.

In other words, in order to exert the characteristics of the wavelength conversion unit containing plural kinds of phosphors to the maximum extent in a light-emitting device, it is important to configure an optimal stacked-layer state of the phosphors taking into consideration the excitation characteristics of the respective phosphors.

On the other hand, in order to enhance color reproducibility of the white light-emitting device, it is desirable to use a light source exhibiting high spectral purity for each of three primary colors of red, green and blue. It is conceivable to use an LED (light-emitting diode) or a semiconductor laser, for example, for each color light source. However, it is not possible to obtain a semiconductor light source having good luminous efficiency of green. Further, the luminance of each of the semiconductor light sources needs to be controlled independently from each other, which requires a drive circuit of a large scale.

As a method of implementing a white light source using one kind of semiconductor light source, Japanese Patent Laying-Open No. 10-242513 discloses a method of using a combination of a blue LED and a phosphor that is excited by the blue light and emits yellow light. With this method, however, there is a problem that the color reproducibility is poor, since the spectral purity of green is low, in addition to insufficient red component.

Similarly, there have been proposed various methods in each of which an LED for emitting light having a wavelength in the range from ultraviolet light of relatively longer wavelength to blue (i.e., from 380 nm to 480 nm) is combined with a phosphor that emits light of blue, green or red in response to the primary light emitted from the LED. For example, Japanese Patent Laying-Open No. 2004-327492 discloses a method of using a phosphor only for green light for the purpose of enhancing luminous efficiency of green. The method disclosed in this document, however, still requires a drive circuit of a large scale, since it uses plural kinds of semiconductor light-emitting elements.

Japanese Patent Laying-Open No. 2002-171000 discloses a method of combining an LED for emitting ultraviolet light and plural kinds of phosphors that emit lights of blue, green and red in response to the primary light emitted from the LED. The document however gives no suggestion about an optimal combination of the LED and the plural kinds of phosphors, particularly about the combination for producing a light source able to be regarded as blackbody radiation and at the same time for achieving high luminous efficiency and good color reproducibility over a wide range. In particular, with the phosphors disclosed in Japanese Patent Laying- Open No. 2002-171000, luminous efficiency is insufficient especially in the phosphor for emitting red light.

At present, a white light-emitting device mainly includes a light-emitting element for emitting blue light in combination with a trivalent cerium-activated $(Y,Gd)_3(Al, Ga)_5O_{12}$ phosphor or a divalent europium-activated $(Sr,Ba,Ca)_2SiO_4$ phosphor for being excited by the blue light and then emitting yellow light.

Such a white light-emitting device, however, is not suitable for use as a backlight of a large LCD (especially for a LCD-TV), since its color reproducibility (NTSC ratio) is a little under 50%. That is, although the white light-emitting device having the combination of a semiconductor light-emitting element and a phosphor is advantageous in that it does not include mercury and can achieve low power consumption, downsizing and high luminance as compared to the cold cathode fluorescent lamp mainly used at present, there is an urgent need for improvement of its color reproducibility (NTSC ratio).

Here, the NTSC ratio is normalization with respect to an area of a triangle formed by connecting the chromaticity coordinates (x, y) of red (0.670, 0.330), green (0.210, 0.710) and blue (0.140, 0.080) in the XYZ color system chromaticity diagram defined by the National Television System Committee (NTSC).

Japanese Patent Laying-Open No. 2003-121838 discloses a prior art that has focused on color reproducibility (NTSC ratio) in the LCD. This document describes that a backlight light source has a spectral peak in the range from 505 nm to 535 nm; that an activator in a phosphor for emitting green light used in the light source includes europium, tungsten, tin, antimony, or manganese; and that $MgGa_2O_4$:Mn and $Zn_2SiO_4$:Mn are used as the phosphors for emitting green light in the embodiment. In the case that the peak wavelength of the light-emitting element is in the range from 380 nm to 450 nm, however, it cannot be said that every phosphor containing europium, tungsten, tin, antimony, or manganese can suitably be used. More specifically, $MgGa_2O_4$:Mn and $Zn_2SiO_4$:Mn mentioned in the embodiment of Japanese Patent Laying-Open No. 2003-121838 each have their very low luminous efficiency with the excitation light in the range from 380 nm to 450 nm, and thus these phosphors are not suitable for use in the present invention.

Further, Japanese Patent Laying-Open No. 2004-287323 describes that not only an RGB (red, green, blue)-LED having LED chips for emitting red, green and blue lights, respectively, contained in a package, but also a tri-color type fluorescent tube, an ultraviolet LED+RGB phosphors, an organic EL light source, and the like can be used as a backlight. In this document, however, there is no specific description regarding the RGB phosphors in the ultraviolet LED+RGB phosphors.

SUMMARY OF THE INVENTION

In view of the above-described state of the prior art, an object of the present invention is to provide a light-emitting device that includes a wavelength conversion unit containing plural kinds of phosphors for emitting light with high efficiency in response to light in the wavelength range from 380 nm to 450 nm emitted from a semiconductor light-emitting element, wherein it is possible to readily set color of light to be emitted from the device and also achieve high luminance. Another object of the present invention is to provide a white light-emitting device having excellent color reproducibility (NTSC ratio).

A light-emitting device according to an aspect of the present invention includes: a light-emitting element for emitting primary light; and a wavelength conversion unit for absorbing part of the primary light and then emitting secondary light having a wavelength greater than that of the primary light; wherein the wavelength conversion unit includes plural kinds of phosphors different in light absorption characteristic from each other, and at least one kind of phosphor among the plural kinds of phosphors has an absorption characteristic that can absorb the secondary light emitted by at least another kind of phosphor among the plural kinds of phosphors. With this light-emitting device, it is possible to readily set color of light to be emitted from the device and also achieve high luminance.

Preferably, a phosphor for emitting light of a relatively longer wavelength among the plural kinds of phosphors is arranged closer to the light-emitting element. With this configuration, a color light emitted from each of the plural kinds of phosphors toward the outside of the light-emitting device can efficiently be extracted to the outside of the device, without being absorbed again by the other phosphor(s) that is/are for emitting the other color light(s) and arranged on the outer side. Further, light emitted inward contributes to excitation of the phosphor(s) that is/are for emitting light(s) of longer wavelength(s) and arranged on the inner side. Accordingly, emission loss in the light-emitting device as a whole can be restricted to the minimum level.

The light-emitting element used in the present invention can be produced using a gallium nitride-based semiconductor.

The phosphor for emitting blue light used in the present invention may include at least one kind selected from a divalent europium-activated halophosphate phosphor represented by $(M1,Eu)_{10}(PO_4)_6.Cl_2$, a divalent europium-activated aluminate phosphor represented by $a(M2,Eu)O.bAl_2O_3$, and a divalent europium-manganese co-activated aluminate phosphor represented by $a(M2,Eu_cMn_d)O.bAl_2O_3$, where M1 represents at least one kind of element selected from Mg, Ca, Sr and Ba; M2 represents at least one kind of element selected from Mg, Ca, Sr, Ba and Zn; and a, b, c, and d represent numbers satisfying a>0, b>0, $0.1 \leq a/b \leq 1.0$, and $0.001 \leq d/c \leq 0.2$.

The phosphor for emitting green light used in the present invention may include at least one kind selected from a divalent europium-manganese co-activated aluminate phosphor represented by $a(M2,Eu_e,Mn_f)O.bAl_2O_3$, a divalent europium-activated silicate phosphor represented by $2(M1_{1-g}, Eu_g)O.SiO_2$, and a trivalent cerium-activated silicate phosphor represented by $MI_3(MII_{1-h},Ce_h)_2(SiO_4)_3$, where M2 represents at least one kind of element selected from Mg, Ca, Sr, Ba and Zn; a, b, e, and f represent numbers satisfying a>0, b>0, $0.1 \leq a/b \leq 1.0$, and $0.3 \leq f/e \leq 5.0$; M1 represents at least one kind of element selected from Mg, Ca, Sr and Ba; g represents a number satisfying $0.005 \leq g \leq 0.10$; MI represents at least one kind of element selected from Mg, Ca, Sr and Ba; MII represents at least one kind of element selected from Al, Ga, In, Sc, Y, La, Gd and Lu; and h represents a number satisfying $0.005 \leq h \leq 0.5$.

The phosphor for emitting red light used in the present invention may include a divalent europium-activated nitride phosphor represented by $(MIII_{1-j},Eu_j)MIVSiN_3$, where MIII represents at least one kind of element selected from Mg, Ca, Sr and Ba; MIV represents at least one kind of element selected from Al, Ga, In, Sc, Y, La, Gd and Lu; and j represents a number satisfying $0.001 \leq j \leq 0.05$.

A light-emitting device according to another aspect of the present invention includes: a light-emitting element for emitting primary light; and a wavelength conversion unit for absorbing at least part of the primary light and emitting secondary light having a wavelength longer than that of the primary light; wherein the wavelength conversion unit includes at least a phosphor for emitting green light and a phosphor for emitting red light, and the phosphor for green light includes a divalent europium-manganese co-activated aluminate phosphor represented by a(M2,Eu$_e$,Mn$_f$)O.bAl$_2$O$_3$, where M2 represents at least one kind of element selected from Mg, Ca, Sr, Ba and Zn; and a, b, e and f represent numbers satisfying a>0, b>0, 0.1≤a/b≤1.0 and 0.3≤f/e≤5.0.

In this light-emitting device, the phosphor for green light has a narrow emission spectrum, so that good color reproducibility can be obtained using one semiconductor light-emitting element. More specifically, Eu serving as the activator absorbs the primary light sufficiently but itself hardly emits light. The absorbed energy is transferred to Mn, and then green light is generated as emission from Mn. Due to the narrow emission spectrum from Mn, green color having a narrow spectral width is obtained with high efficiency.

Further, in the case that Sr is added to the base crystal of the phosphor, the primary light having even a relatively longer wavelength can also serve as the excitation light. This can prevent the mold resin containing the phosphor from deteriorating due to radiation of short-wavelength light, and thus the lifetime of the light-emitting device can be elongated.

Preferably, the phosphor for red light includes a divalent europium-activated nitride phosphor represented by (M3$_{1-g}$Eu$_g$)M4SiN$_3$, where M3 represents at least one kind of element selected from Mg, Ca, Sr and Ba; M4 represents at least one kind of element selected from Al, Ga, In, Sc, Y, La, Gd and Lu; and g represents a number satisfying 0.001≤g≤0.05. With this phosphor for emitting red light, red light of a narrow spectral width can be obtained with high efficiency.

The wavelength conversion unit may further include a phosphor for emitting blue light, which contains at least one kind selected from a divalent europium-activated halophosphate phosphor represented by (M1,Eu)$_{10}$(PO$_4$)$_6$.Cl$_2$, a divalent europium-activated aluminate phosphor represented by a(M2,Eu)O.bAl$_2$O$_3$, and a divalent europium-manganese co-activated aluminate phosphor represented by a(M2,Eu$_c$,Mn$_d$)O.bAl$_2$O$_3$, where M1 represents at least one kind of element selected from Mg, Ca, Sr and Ba; M2 represents at least one kind of element selected from Mg, Ca, Sr, Ba and Zn; and a, b, c and d represent numbers satisfying a>0, b>0, 0.1≤a/b≤1.0, and 0.001≤d/c≤0.2. With this phosphor for emitting blue light, blue light of a narrow spectral width can be obtained with high efficiency.

Preferably, the light-emitting element is formed of a gallium nitride-based semiconductor, and the primary light has a peak wavelength in the range from 380 nm to 450 nm. More preferably, the peak wavelength of the primary light is in the range from 390 nm to 420 nm. Such a semiconductor light-emitting element can efficiently excite the three kinds of phosphors for emitting blue, green and red lights.

Wavelength components of the primary light emitted from the light-emitting element and wavelength components of the secondary light emitted from each of the phosphors for emitting red light, green light and blue light can be adjusted such that the light emitted from the light-emitting device has chromaticity that is regarded as blackbody radiation at a prescribed color temperature. By such adjustment, the light-emitting device can emit natural (white) light and thus it can be used as a light source for illumination of good quality.

Preferably, the light-emitting element is covered with a plurality of resin layers each of which contains one of the phosphors for emitting red light, green light and blue light, and the phosphor contained in the resin layer closer to the light-emitting element emits the secondary light having a longer peak wavelength as compared to the phosphor contained in the resin layer farther from the light-emitting element. With this arrangement, the light emitted from the phosphor in the resin layer arranged closer to the light-emitting element is prevented from being absorbed in the phosphor within the resin layer arranged farther from the light-emitting element, whereby making it possible to obtain a white light-emitting device of high efficiency. It is also possible to design a white light-emitting device based on a result of measured luminous efficiency with respect to thickness of every resin layer containing a single kind of phosphor.

Preferably, the light-emitting element is molded with a plurality of resin layers that are stacked one on another such that each layer has a predetermined thickness. This can facilitate fabrication of the white light-emitting device.

The light-emitting device according to the present invention can be fabricated by a method including the steps of: mounting a light-emitting element on a bottom surrounded by reflective inner wall surfaces in a package; introducing and setting a first liquid resin kneaded with a first kind of phosphor to cover the light-emitting element mounted in the package; and introducing and setting a second liquid resin kneaded with a second kind of phosphor on the first resin thus set and on the reflective surfaces, wherein the second kind of phosphor is for emitting secondary light having a shorter wavelength as compared with the first kind of phosphor.

Further, the light-emitting device according to the present invention may be fabricated by another method including the steps of: mounting a light-emitting element on a bottom surrounded by reflective inner wall surfaces in a package; introducing a liquid resin kneaded with plural kinds of phosphors having different median values of particle sizes to cover the light-emitting element mounted in the package; and leaving the introduced liquid resin at rest for a prescribed time period to cause the phosphors to settle such that a particular kind of phosphor having a greater median value of particle size among the plural kinds of phosphors has a greater concentration near the light-emitting element.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Example 1

Figure 1:
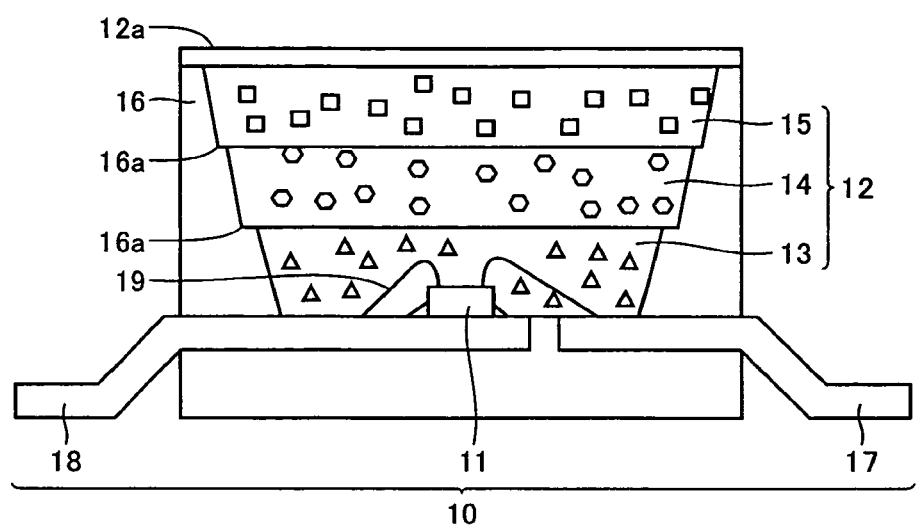
FIG. 1 is a schematic vertical cross sectional view showing a structure of a light-emitting device according to an embodiment of the present invention.

In FIG. 1, a light-emitting device according to Example 1 of the present invention is illustrated in a schematic vertical cross sectional view. This light-emitting device 10 includes a light-emitting element 11 for emitting primary light, and a wavelength conversion unit 12 that absorbs at least part of the primary light and emits secondary light having a wavelength longer than that of the primary light. Light-emitting element 11 is mounted on a cathode terminal 18 and it is electrically connected to an anode terminal 17 and cathode terminal 18 via gold wires 19.

For light-emitting element 11, it is possible to use a gallium nitride (GaN)-based light-emitting diode having an emission peak wavelength at 410 nm, for example.

Wavelength conversion unit 12 includes a layer 13 that contains a phosphor having a composition of $(Ca_{0.98}Eu_{0.02})AlSiN_3$ for emitting red light, a layer 14 that contains a phosphor having a composition of $(Ba_{0.85}Eu_{0.15})(Mg_{0.80}Mn_{0.20})Al_{10}O_{17}$ for emitting green light, and a layer 15 that contains a phosphor having a composition of $(Ba_{0.80}Eu_{0.20})MgAl_{10}O_{17}$ for emitting blue light.

Figure 2:
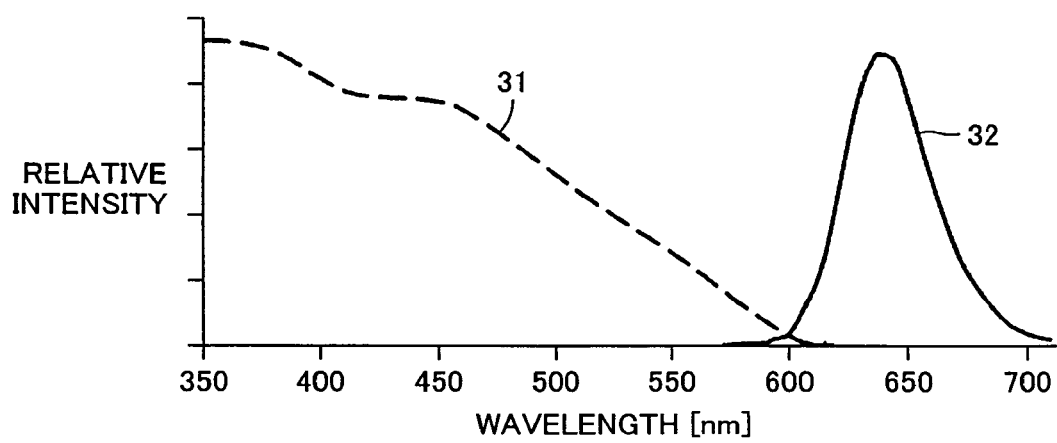
FIG. 2 is a graph showing spectral distribution of excitation and emission of a phosphor for emitting red light.
Figure 3:
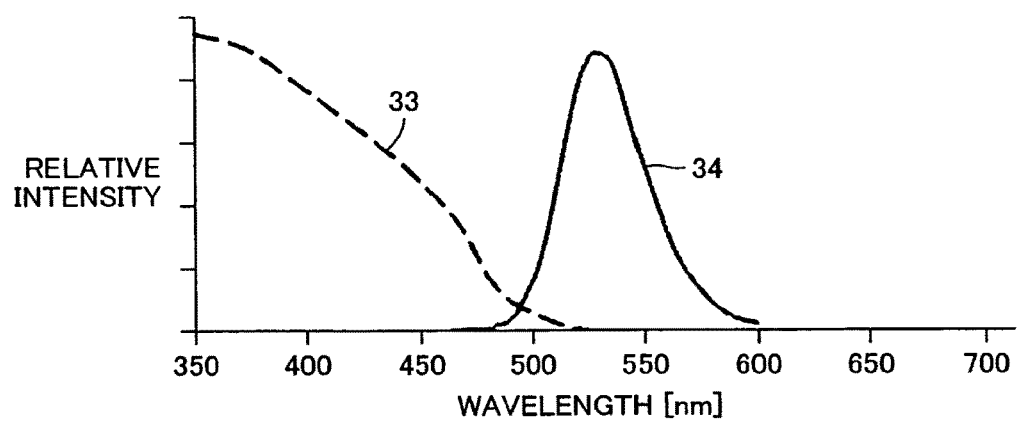
FIG. 3 is a graph showing spectral distribution of excitation and emission of a phosphor for emitting green light.
Figure 4:
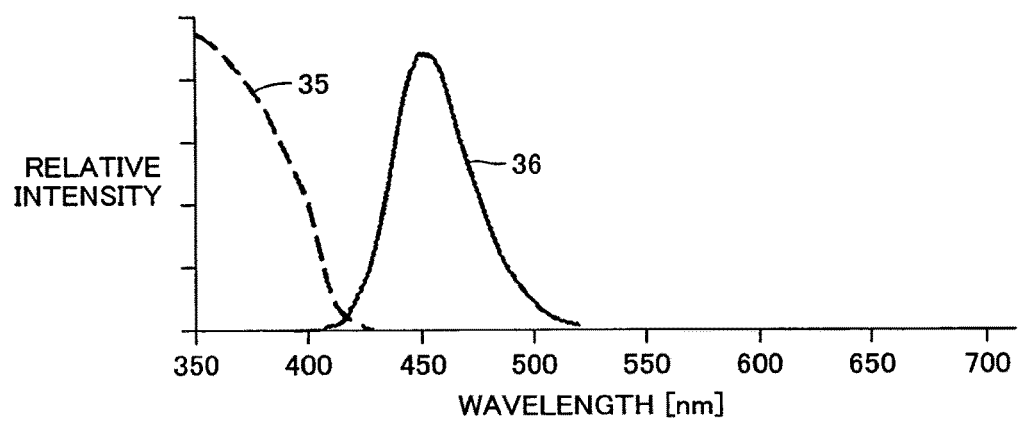
FIG. 4 is a graph showing spectral distribution of excitation and emission of a phosphor for emitting blue light.

FIG. 2 shows spectral distribution of excitation and emission of the phosphor for emitting red light used in Example 1; FIG. 3 shows spectral distribution of excitation and emission of the phosphor for emitting green light; and FIG. 4 shows spectral distribution of excitation and emission of the phosphor for emitting blue light. Specifically, in each graph shown in FIGS. 2-4, a horizontal axis represents the wavelength (nm) of light, and a vertical axis represents the relative intensity of light. Further, curves 31, 33 and 35 in the graphs represent spectral distribution of excitation of the phosphors, and curves 32, 34 and 36 represent spectral distribution of emission from the phosphors.

As seen from FIGS. 2-4, each phosphor in Example 1 can very efficiently emits red, green or blue light in response to the primary light having the peak wavelength of 410 nm.

Further, it is recognized that the phosphor for emitting red light can emit the red light by absorbing even the green light (wavelength around 520 nm) and the blue light (wavelength around 450 nm) emitted from the phosphors for emitting green and blue lights, respectively.

However, it is not beneficial to excite the phosphor for emitting red light by the green light (near 520 nm wavelength) and the blue light (near 450 nm wavelength) emitted as the secondary lights from the phosphors excited by the primary light, since it would decrease wavelength conversion efficiency as a whole.

More specifically, to obtain a light-emitting device of high luminance, it is important to stack phosphor layer 13 for red light, phosphor layer 14 for green light and phosphor layer 15 for blue light in this order, as in this Example 1. It is noted that the phosphor for green light and the phosphor for blue light may be mixed to form a single light-emitting layer, since the phosphor for green light cannot be excited by the blue light to emit green light.

In Example 1, each of the phosphor for red light, the phosphor for green light and the phosphor for blue light is kneaded into a (silicone-based or epoxy-based) binder resin, which is then introduced into a cup 16 of the device package shown in FIG. 1 in order of red light-emitting layer 13, green light-emitting layer 14 and blue light-emitting layer 15, which are then set to form a phosphor layered structure 12.

On the inner wall of cup 16, terraces 16a are provided so as to prevent the resins kneaded with the phosphors and introduced into the cup from climbing up by surface tension along the inner wall of the cup, thereby making it possible to obtain a uniform thickness for each light-emitting layer. Further, it is preferable that the inner wall of the cup is made to be inclined more steeply in the upper part than in the lower part with the boundary formed by terrace 16a. This can reduce shade of terrace 16a, which is caused in the upper phosphor layer by light emitted from the lower phosphor layer.

As Comparative Example 1, phosphors of the exactly same kinds as in Example 1 were mixed at a mass ratio of phosphor for blue light:phosphor for green light:phosphor for red light=2.0:1.5:1.0, to form a single light-emitting layer serving as the wavelength conversion unit.

Table 1 shows evaluation results of white light emitted from the light-emitting devices of Example 1 and Comparative Example 1.

TABLE 1

|  | Brightness (relative value) | Tc-duv |
| --- | --- | --- |
| Example 1 | 100% | 7000K + 0.001 |
| Comparative Example 1 | 70% | 7000K + 0.001 |

As seen from Table 1, while the light-emitting devices of Example 1 and Comparative Example 1 emit light of the same color, the light-emitting device of Example 1 is considerably improved in brightness as compared to Comparative Example 1.

Here, "Tc" represents the correlated color temperature of light emitted from the light-emitting device, and "duv" represents the deviation of the chromaticity point of the emitted light from the blackbody radiation locus (i.e., the length of the normal drawn from the chromaticity point of the emitted light down to the blackbody radiation locus on the U*V*W chromaticity diagram (CIE 1964 uniform color space)). It is generally considered that light having duv of less than 0.01 is felt as natural (white) light, similarly to light emitted from a common tungsten filament light bulb and the like. With the blackbody radiation temperature of 7000K, natural white light is obtained, since it is close to the color temperature of the sun.

In each of Example 1 and Comparative Example 1, although the primary light emitted from the light-emitting element has its peak wavelength of 410 nm in the wavelength range effective for excitation of the phosphors, it is low in luminous efficacy and thus does not contribute to brightness of the light-emitting device even when it is leaked outside. Therefore, it is preferable that a sheet 12a coated with an optical film (for example, multi-layered interference film) having the property of reflecting only the primary light is laminated on the outermost surface of phosphor layer structure 12. The primary light reflected by this sheet 12a can again contribute to excitation of the phosphor layers, thereby enabling emission of brighter light from the light-emitting device as a whole.

Example 2

In Example 2 of the present invention, a gallium nitride (GaN)-based light-emitting diode having a peak wavelength at 460 nm was used as the light-emitting element.

For the wavelength conversion unit, there were used a phosphor for green light represented by a composition of $(Sr_{0.75}Ba_{0.24}Eu_{0.01})_2SiO_4$ and a phosphor for red light represented by a composition of $(Ca_{0.985}Eu_{0.015})AlSiN_3$. It is recognized from FIG. 2 that the phosphor for red light can absorb green light (wavelength near 550 nm) emitted from the phosphor for green light and then can emit red light.

The light-emitting device of Example 2 was fabricated using the light-emitting diode and the phosphors, in a similar manner as in Example 1. As Comparative Example 2, there was fabricated a light-emitting device having a wavelength conversion unit formed of a single light-emitting layer made by mixing exactly the same kinds of phosphors as in Example 2.

Properties of the light-emitting devices of Example 2 and Comparative Example 2 were evaluated, of which results are shown in Table 2.

TABLE 2

|  | Brightness (relative value) | Tc-duv |
|---|---|---|
| Example 2 | 100% | 6000K − 0.001 |
| Comparative Example 2 | 75% | 6000K − 0.001 |

As seen from Table 2, while the light-emitting device of Example 2 emits light having the same color as that emitted from the light-emitting device of Comparative Example 2, its brightness is considerably improved.

Examples 3-8

Light-emitting devices of Examples 3-8 and Comparative Examples 3-8 were fabricated in a similar manner as in Example 1 and Comparative Example 1, except that the emission peak wavelengths of the light-emitting elements and the kinds of phosphors used were changed. Evaluation results of their properties are shown in Table 3.

TABLE 3

|  | Peak wavelength of primary light | Phosphors | Brightness (relative value) | Tc-duv |
|---|---|---|---|---|
| Ex. 3 | 410 nm | red: $(Ca_{0.94}Sr_{0.05}Eu_{0.01})AlSiN_3$<br>green: $(Sr_{0.70}Ba_{0.28}Eu_{0.02})_2SiO_4$<br>blue: $(Sr_{0.74}Ba_{0.20}Ca_{0.05}Eu_{0.01})_{10}(PO_4)_6 \cdot Cl_2$ | 100% | 6500K − 0.003 |
| Com. Ex. 3 | " | red: $(Ca_{0.94}Sr_{0.05}Eu_{0.01})AlSiN_3$<br>green: $(Sr_{0.70}Ba_{0.28}Eu_{0.02})_2SiO_4$<br>blue: $(Sr_{0.74}Ba_{0.20}Ca_{0.05}Eu_{0.01})_{10}(PO_4)_6 \cdot Cl_2$ | 73% | " |
| Ex. 4 | 410 nm | red: $(Ca_{0.99}Eu_{0.01})(Al_{0.90}Ga_{0.10})SiN_3$<br>green: $(Ba_{0.86}Eu_{0.14})(Mg_{0.75}Mn_{0.25})Al_{10}O_{17}$<br>blue: $(Ba_{0.86}Eu_{0.14})(Mg_{0.99}Mn_{0.01})Al_{10}O_{17}$ | 100% | 7500K + 0.001 |
| Com. Ex. 4 | " | red: $(Ca_{0.99}Eu_{0.01})(Al_{0.90}Ga_{0.10})SiN_3$<br>green: $(Ba_{0.86}Eu_{0.14})(Mg_{0.75}Mn_{0.25})Al_{10}O_{17}$<br>blue: $(Ba_{0.86}Eu_{0.14})(Mg_{0.99}Mn_{0.01})Al_{10}O_{17}$ | 70% | " |
| Ex. 5 | 450 nm | red: $(Ca_{0.98}Eu_{0.02})AlSiN_3$<br>green: $(Sr_{0.72}Ba_{0.25}Ca_{0.01}Eu_{0.02})_2SiO_4$ | 100% | 5800K − 0.002 |
| Com. Ex. 5 | " | red: $(Ca_{0.98}Eu_{0.02})AlSiN_3$<br>green: $(Sr_{0.72}Ba_{0.25}Ca_{0.01}Eu_{0.02})_2SiO_4$ | 75% | " |
| Ex. 6 | 450 nm | red: $(Ca_{0.97}Ba_{0.01}Eu_{0.02})(Al_{0.99}In_{0.01})SiN_3$<br>green: $Mg_3(Al_{0.85}Ce_{0.15})_2(SiO_4)_3$ | 100% | 7500K − 0.003 |
| Com. Ex. 6 | " | red: $(Ca_{0.97}Ba_{0.01}Eu_{0.02})(Al_{0.99}In_{0.01})SiN_3$<br>green: $Mg_3(Al_{0.85}Ce_{0.15})_2(SiO_4)_3$ | 70% | " |
| Ex. 7 | 465 nm | red: $(Ca_{0.98}Eu_{0.02})AlSiN_3$<br>green: $Ca_3(Y_{0.80}Al_{0.10}Ce_{0.10})_2(SiO_4)_3$ | 100% | 4200K + 0.002 |
| Com. Ex. 7 | " | red: $(Ca_{0.98}Eu_{0.02})AlSiN_3$<br>green: $Ca_3(Y_{0.80}Al_{0.10}Ce_{0.10})_2(SiO_4)_3$ | 72% | " |
| Ex. 8 | 460 nm | red: $(Ca_{0.98}Eu_{0.02})AlSiN_3$<br>green: $(Sr_{0.76}Ba_{0.22}Eu_{0.02})_2SiO_4$ | 100% | 3500K − 0.002 |
| Com. Ex. 8 | " | red: $(Ca_{0.98}Eu_{0.02})AlSiN_3$<br>green: $(Sr_{0.76}Ba_{0.22}Eu_{0.02})_2SiO_4$ | 75% | " |

As seen from Table 3, the light-emitting devices of Examples 3-8 of the present invention are considerably improved in brightness as compared to Comparative Examples 3-8, respectively.

Example 9

FIG. 1 may be referred to also for a white light-emitting device according to Example 9 of the present invention. A white light-emitting device 10 of Example 9 includes a light-emitting element 11 for emitting primary light, and a wavelength conversion unit 12 that absorbs at least part of the primary light and emits secondary light having a wavelength longer than that of the primary light. For light-emitting element 11, it is possible to use a gallium nitride (GaN)-based light-emitting diode having a peak wavelength at 410 nm.

For wavelength conversion unit 12, a resin layer 13 that contains a phosphor for red light represented by a composition of $(Ca_{0.98}Eu_{0.02})AlSiN_3$, a resin layer 14 that contains a phosphor for green light represented by a composition of $(Ba_{0.85}Eu_{0.15})(Mg_{0.80}Mn_{0.20}Al_{10}O_{17})$, and a resin layer 15 that contains a phosphor for blue light represented by a composition of $(Ba_{0.80}Eu_{0.20})MgAl_{10}O_{17}$ were stacked successively in this order, with the three kinds of phosphors being contained at a mass ratio of 1:1:1.

Figure 5:
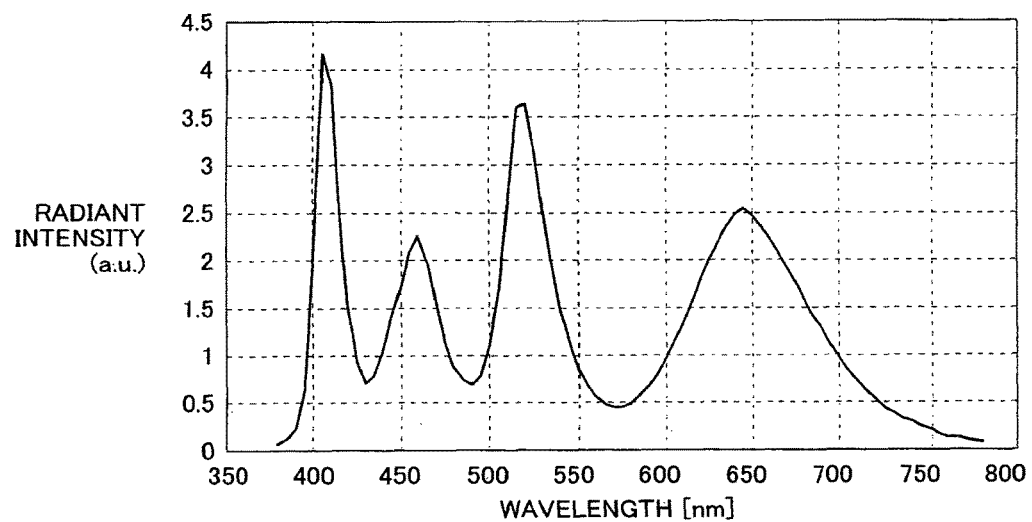
FIG. 5 is a graph showing emission spectral distribution in a light-emitting device according to an embodiment of the present invention.

FIG. 5 is a graph showing emission spectral distribution of the white light-emitting device of Example 9. Specifically, in the graph, a horizontal axis represents emission wavelength (nm), and a vertical axis represents radiant intensity (a.u.: arbitrary unit) of light. It is found in this graph that the light from the phosphor for emitting green light (peak wavelength around 520 nm) as the secondary light has a narrow spectral width corresponding to the light emitted from Mn.

Figure 6:
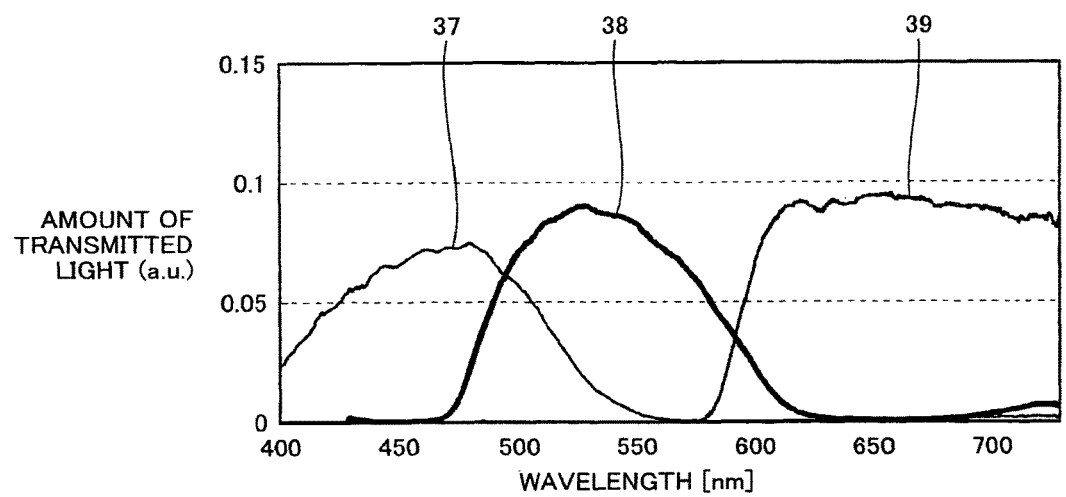
FIG. 6 is a graph showing spectral characteristics of color filters used for evaluation of properties of the light-emitting device.

In the white light-emitting device of Example 9, brightness and color reproducibility (NTSC ratio) were evaluated. FIG. 6 shows the spectral characteristics of the color filters of blue, green and red that were used for measurement of the color reproducibility. In this graph, a horizontal axis represents the wavelength (nm) of light, and a vertical axis represents the amount (a.u.) of transmitted light. Further, curves 37, 38 and 39 in the graph represent the characteristics of the blue filter, the green filter and the red filter, respectively.

For the purpose of comparison with Example 9, a light-emitting device of Comparative Example 9 was fabricated. The light-emitting device of Comparative Example 9 differs from that of Example 9 only in that a single resin layer was used for the wavelength conversion unit, which contains a phosphor for blue light represented by a composition of $(Ba_{0.80}Eu_{0.20})MgAl_{10}O_{17}$ and a phosphor for yellow light represented by a composition of $(Sr_{0.92}Ba_{0.05}Ca_{0.01}Eu_{0.02})_2SiO_4$ mixed at a mass ratio of 1.5:1.0.

Table 4 shows evaluation results of the white light emitted by the light-emitting devices of Example 9 and Comparative Example 9.

TABLE 4

| | Brightness (relative value) | Tc-duv | Color reproducibility (NTSC ratio) |
|---|---|---|---|
| Ex. 9 | 100.0% | 6600K + 0.007 | 85.0% |
| Com. Ex. 9 | 97.3% | 6600K + 0.007 | 48.1% |

As seen from Table 4, the light-emitting device of Example 9 is considerably improved not only in brightness but also in color reproducibility (NTSC ratio) as compared to Comparative Example 9.

In Table 4, the blackbody radiation temperature of 6600K, which is close to the temperature of the sun, means that natural white light can be obtained.

Figure 8:
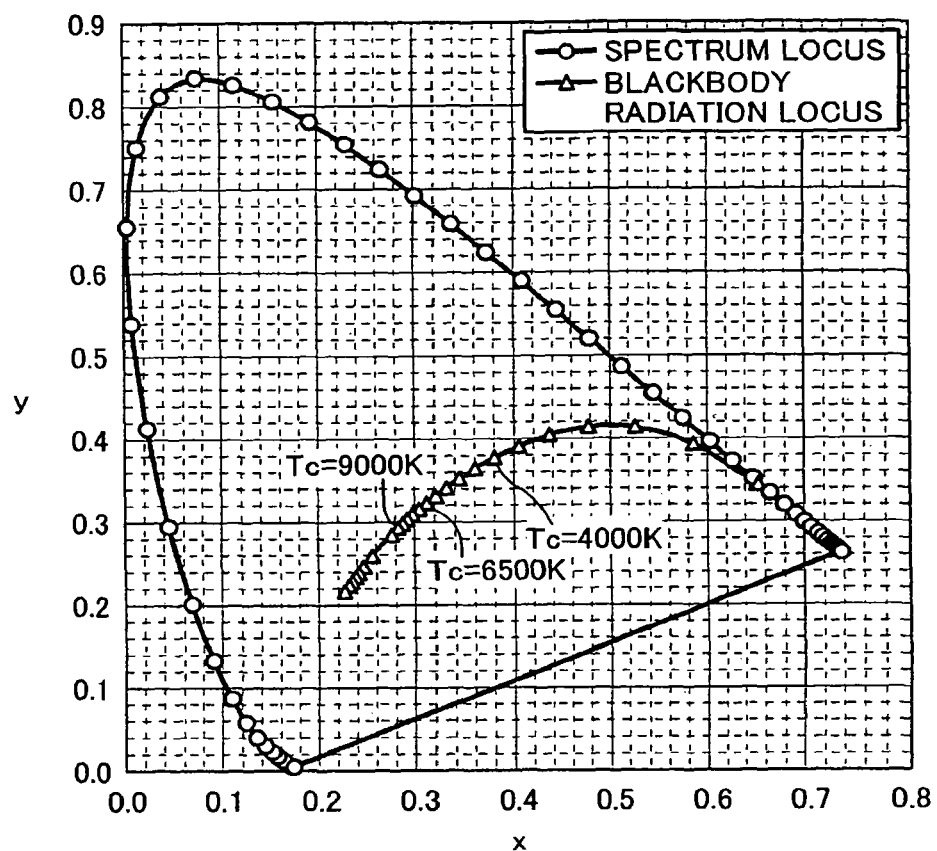
FIG. 8 is an xy chromaticity diagram showing the relation between the temperature of blackbody radiation and the chromaticity coordinates.

For the purpose of reference, an xy chromaticity diagram of FIG. 8 shows the relation between the blackbody radiation temperature and the xy chromaticity coordinates. In this chromaticity diagram, a plurality of circles represent the spectrum locus, and a plurality of triangles represent the blackbody radiation locus.

The light-emitting device of Example 9, for which FIG. 1 may be referred to, is fabricated more specifically as follows. GaN-based light-emitting element 11 is mounted on one of a pair of lead frames (thin metal plates) 17, 18, and is electrically connected to lead frames 17, 18 via a pair of wires 19.

A bowl-shaped cup 16 is formed surrounding light-emitting element 11 by using a resin of white color having high reflectivity for visible light. On the inner wall of the bowl-shaped cup, terraces 16a are provided to stabilize the levels of the liquid resins containing the phosphors. As a result, each of the resin layers 13, 14 and 15 containing the phosphors can have approximately a predetermined uniform thickness.

Light-emitting element 11 is molded with a resin layer 13 added with a phosphor for secondary light of red, a resin layer 14 added with a phosphor for secondary light of green, and a resin layer 15 added with a phosphor for secondary light of blue, successively in this order. After molding of a resin layer added with one kind of phosphor, it may be set provisionally before introducing the next resin layer. This can suppress reduction of production efficiency while preventing the adjacent resin layers from being mixed with each other.

Although the inner wall of cup 16 may be left with the white color resin material, it is more preferable to coat the inner wall with a metal having high reflectivity for visible light, such as silver, aluminum or the like, in order to further improve the luminous efficiency of the light-emitting device.

Figure 7:
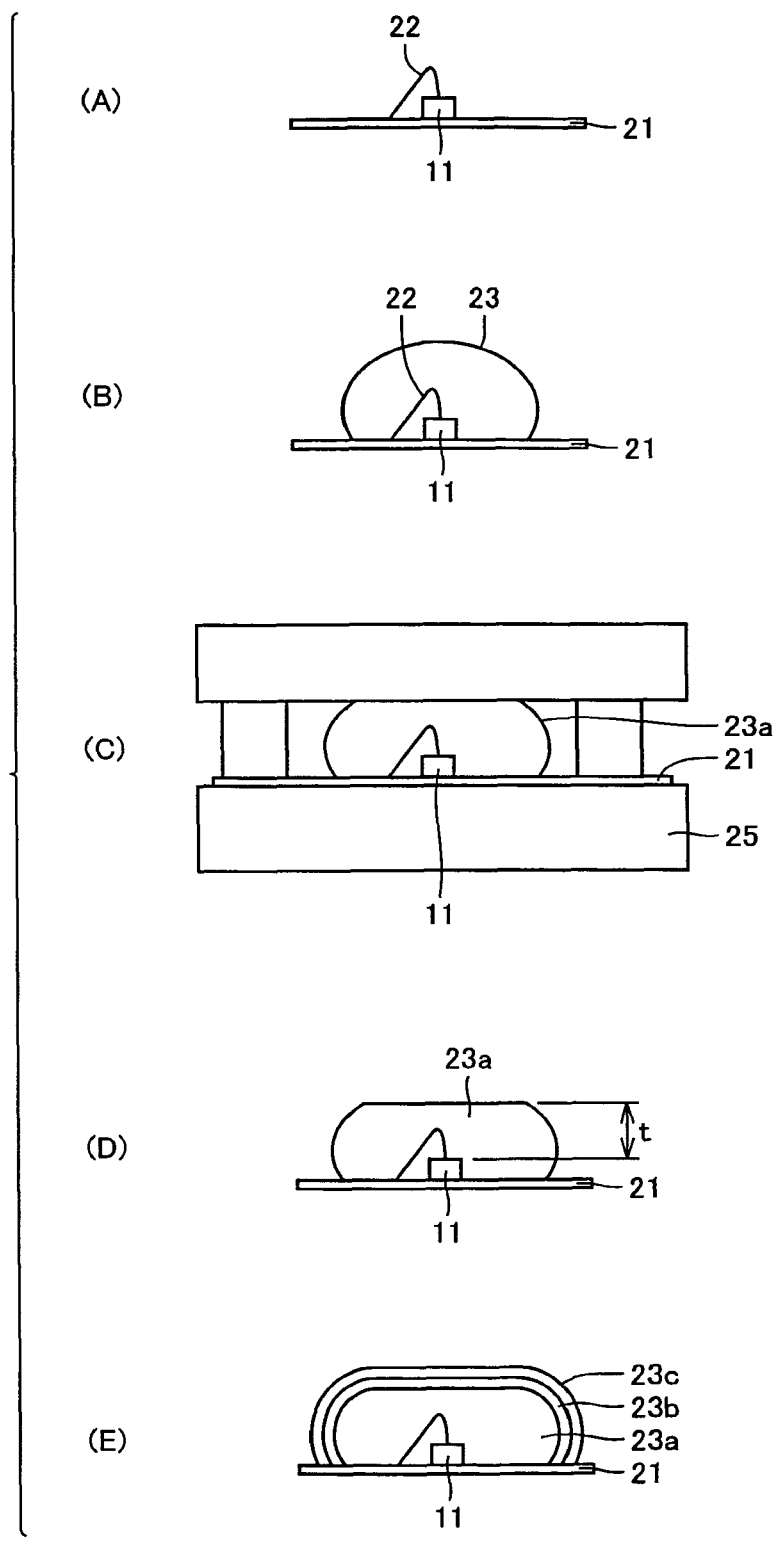
FIG. 7 shows schematic cross sectional views illustrating a fabrication process of a light-emitting device according to another embodiment of the present invention.

In FIG. 7, an alternative fabrication process of a light-emitting device related to Example 9 is illustrated in schematic cross sections.

In FIG. 7(A), GaN-based light-emitting element 11 is mounted on a hard wiring-board 21, and electrically connected thereto via wire 22. As shown in FIG. 7(B), light-emitting element 11 is molded successively with a resin layer added with a phosphor for secondary light of red, a resin layer added with a phosphor for secondary light of green, and a resin layer added with a phosphor for secondary light of blue, and thus is covered with a resin dome 23 containing these resin layers.

Resin dome 23 can be formed without use of a die, a metallic mold or the like, by using a resin having high thixotropy. As shown in FIG. 7(C), however, a die assembly may be used to accurately regulate the thicknesses of the resin layers contained in resin dome 23.

In FIG. 7(C), light-emitting element 11 is covered with resin layer 23a for red light that contains the phosphor for emitting red light. Resin layer 23a is provisionally set before being pressed by a press mold 25. This allows the thickness t of resin layer 23a above the top face of light-emitting element 11 to be a predetermined value, as shown in FIG. 7(D). Similarly, resin layer 23b for green that contains the phosphor for emitting green light and resin layer 23c for blue that contains the phosphor for emitting blue light are formed using press mold 25, whereby making it possible to obtain a white light-emitting device including light-emitting element 11 covered with three resin layers 23a, 23b and 23c having the controlled thicknesses, as shown in FIG. 7(E). In this case as well, it is possible to suppress reduction of production efficiency while preventing the adjacent resin layers from being mixed with each other, because light-emitting element 11 is covered with one kind of resin layer which is then provisionally set before being covered with the next resin layer.

Example 10

In Example 10 of the present invention, a gallium nitride (GaN)-based light-emitting diode having a peak wavelength of 390 nm was used as the light-emitting element. For the wavelength conversion unit, there were used a resin layer that contains a phosphor for red light represented by a composition of $(Ca_{0.985}Eu_{0.015})AlSiN_3$, a resin layer that contains a phosphor for green light represented by a composition of $(Ba_{0.70}Sr_{0.10}Eu_{0.20})(Mg_{0.75}Mn_{0.25})Al_{10}O_{17}$, and a resin layer that contains a phosphor for blue light represented by a composition of $(Ba_{0.80}Eu_{0.20})MgAl_{10}O_{17}$.

The light-emitting device of Comparative Example 10 prepared for comparison with Example 10 differs from that of Example 10 only in that there was used a single resin layer which contains a mixture of a phosphor for blue light represented by a composition of $(Ba_{0.80}Eu_{0.20})MgAl_{10}O_{17}$ and a phosphor for yellow light represented by a composition of $(Y_{0.52}Gd_{0.35}Ce_{0.13})_3Al_5O_{12}$.

In Example 10 and Comparative Example 10 also, similarly as in the case of Example 9, the light-emitting devices as shown in FIG. 1 were fabricated and their properties were evaluated. Table 5 shows the evaluation results.

TABLE 5

| | Brightness (relative value) | Tc-duv | Color reproducibility (NTSC ratio) |
|---|---|---|---|
| Ex. 10 | 100.0% | 7700K − 0.001 | 83.8% |
| Com. Ex. 10 | 96.8% | 7700K − 0.001 | 47.9% |

As seen from Table 5, the light-emitting device of Example 10 is also considerably improved not only in brightness but also in color reproducibility (NTSC ratio) as compared to Comparative Example 10.

Examples 11-15

Light-emitting devices of Examples 11-15 of the present invention and Comparative Examples 11-15 for comparison therewith were fabricated similarly as in Example 9 and Comparative Example 9. Evaluation results of their properties are shown in Table 6. In Examples 11-15 and Comparative Examples 11-15, the light-emitting devices as shown in FIG. 1 were fabricated, varying the emission peak wavelengths of the light-emitting elements and the compositions of the phosphors used.

compared to Comparative Examples 11-15 each including a combination of a blue light-emitting element with a divalent europium-activated $(Sr,Ba,Ca)_2SiO_4$ phosphor or a trivalent cerium-activated $(Y,Gd)_3(Al,Ga)_5O_{12}$ phosphor that is excited by the blue light and emits yellow light.

The present invention requires that the peak wavelength of the primary light emitted from the light-emitting element falls within the range from 380 nm to 450 nm. The light-emitting element having the peak wavelength within the range from 390 nm to 420 nm is more suitable for the light-emitting device of the present invention.

In order to significantly improve the color reproducibility (NTSC ratio), it is desirable to narrow the half bandwidth of emission spectrum of the phosphor for emitting green light (or components for emitting green light contained therein). To this end, light emission due to divalent manganese (Mn) as in the present invention is suitable, and then aluminate is suitable for the matrix of the phosphor for emitting green light.

One of features of the above-described Examples is that the resin layers are arranged from the side closer to the light-emitting element in decreasing order of the wavelength of the secondary light emitted by the phosphors contained therein. In the case that a single resin layer containing a mixture of such phosphors for three colors as in the present invention is used for the wavelength conversion unit, however, the color reproducibility (NTSC ratio) is not adversely affected, though the brightness is reduced considerably. Thus, such a single resin layer containing the mixed phosphors of three colors may be used when improvement in color reproducibility (NTSC ratio) alone is pursued.

In the above-described examples, the resin layer containing the phosphor for blue light is stacked on the resin layer containing the phosphor for green light. In the phosphor for green light in the present invention, however, intensity of the

TABLE 6

| | Peak wavelength of primary light | Phosphors | Brightness (relative value) | Tc-duv | Color reproducibility (NTSC ratio) |
|---|---|---|---|---|---|
| Ex. 11 | 425 nm | red: $(Ca_{0.97}Ba_{0.01}Eu_{0.02})(Al_{0.99}In_{0.01})SiN_3$<br>green: $(Ba_{0.50}Sr_{0.35}Eu_{0.15})(Mg_{0.80}Mn_{0.20})Al_{10}O_{17}$<br>blue: $(Sr_{0.64}Ba_{0.30}Ca_{0.05}Eu_{0.01})_{10}(PO_4)_6\cdot Cl_2$ | 100.0% | 9000K − 0.002 | 85.2% |
| Com. Ex. 11 | " | blue: $(Sr_{0.64}Ba_{0.30}Ca_{0.05}Eu_{0.01})_{10}(PO_4)_6\cdot Cl_2$<br>yellow: $(Sr_{0.85}Ba_{0.13}Ca_{0.01}Eu_{0.01})_2SiO_4$ | 97.2% | 9000K − 0.002 | 48.3% |
| Ex. 12 | 400 nm | red: $(Ca_{0.94}Sr_{0.05}Eu_{0.01})AlSiN_3$<br>green: $(Ba_{0.80}Sr_{0.05}Eu_{0.15})(Mg_{0.80}Mn_{0.20})Al_{10}O_{17}$<br>blue: $(Ba_{0.86}Eu_{0.14})(Mg_{0.99}Mn_{0.01})Al_{10}O_{17}$ | 100.0% | 8300K + 0.002 | 85.3% |
| Com. Ex. 12 | " | blue: $(Ba_{0.86}Eu_{0.14})(Mg_{0.99}Mn_{0.01})Al_{10}O_{17}$<br>yellow: $(Y_{0.62}Gd_{0.25}Ce_{0.13})_3(Al_{0.90}Ga_{0.10})_5O_{12}$ | 96.7% | 8300K + 0.002 | 47.8% |
| Ex. 13 | 405 nm | red: $(Ca_{0.99}Eu_{0.01})(Al_{0.90}Ga_{0.10})SiN_3$<br>green: $(Ba_{0.84}Sr_{0.01}Eu_{0.15})(Mg_{0.75}Mn_{0.25})Al_{10}O_{17}$<br>blue: $(Ba_{0.82}Sr_{0.03}Eu_{0.15})MgAl_{10}O_{17}$ | 100.0% | 6500K − 0.002 | 84.8% |
| Com. Ex. 13 | " | blue: $(Ba_{0.82}Sr_{0.03}Eu_{0.15})MgAl_{10}O_{17}$<br>yellow: $(Sr_{0.77}Ba_{0.20}Ca_{0.01}Eu_{0.02})_2SiO_4$ | 97.1% | 6500K − 0.002 | 48.2% |
| Ex. 14 | 430 nm | red: $(Ca_{0.99}Eu_{0.01})AlSiN_3$<br>green: $(Ba_{0.45}Sr_{0.35}Eu_{0.20})(Mg_{0.80}Mn_{0.20})Al_{10}O_{17}$<br>blue: $(Sr_{0.62}Ba_{0.35}Ca_{0.01}Eu_{0.02})_{10}(PO_4)_6\cdot Cl_2$ | 100.0% | 7500K + 0.001 | 84.9% |
| Com. Ex. 14 | " | blue: $(Sr_{0.62}Ba_{0.35}Ca_{0.01}Eu_{0.02})_{10}(PO_4)_6\cdot Cl_2$<br>yellow: $(Sr_{0.61}Ba_{0.35}Ca_{0.03}Eu_{0.01})_2SiO_4$ | 96.6% | 7500K + 0.001 | 48.1% |
| Ex. 15 | 395 nm | red: $(Ca_{0.98}Eu_{0.02})AlSiN_3$<br>green: $(Ba_{0.75}Sr_{0.15}Eu_{0.10})(Mg_{0.75}Mn_{0.25})Al_{10}O_{17}$<br>blue: $(Ba_{0.75}Sr_{0.15}Eu_{0.10})MgAl_{10}O_{17}$ | 100.0% | 8100K − 0.001 | 85.1% |
| Com. Ex. 15 | " | blue: $(Ba_{0.75}Sr_{0.15}Eu_{0.10})MgAl_{10}O_{17}$<br>yellow: $(Y_{0.62}Gd_{0.25}Ce_{0.13})_3(Al_{0.80}Ga_{0.20})_5O_{12}$ | 97.0% | 8100K − 0.001 | 47.7% |

As seen from Table 6, the light-emitting devices of Examples 11-15 containing the phosphors according to the present invention are considerably improved not only in brightness but also in color reproducibility (NTSC ratio), as second light emitted by excitation with the primary blue light having a wavelength around 450 nm is weak. This means that even if the phosphor for green light and the phosphor for blue light are mixed together and contained in a single resin layer, the white light is hardly decreased in brightness, and thus the functions and effects of the present invention can be maintained.

Example 16

Figure 9:
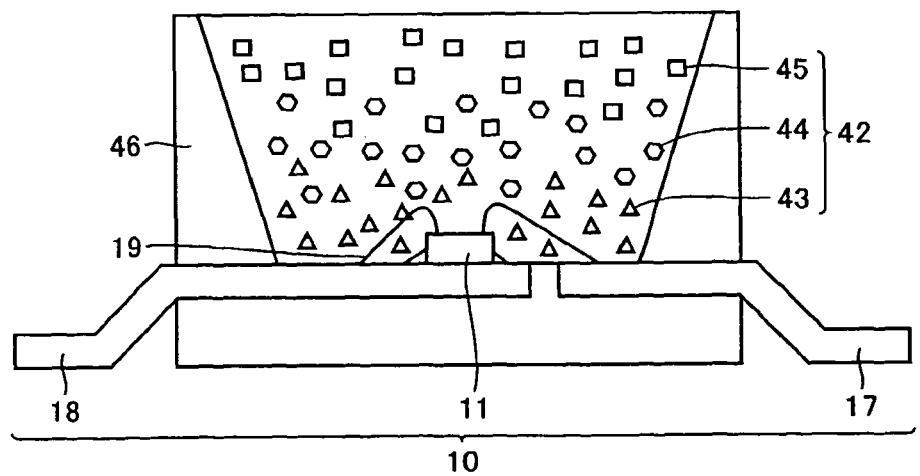
FIG. 9 is a schematic vertical cross sectional view showing a structure of a light-emitting device according to a further embodiment of the present invention.

In FIG. 9, a main part of a light-emitting device according to Example 16 of the present invention is illustrated in a schematic vertical cross sectional view. The light-emitting device of FIG. 9 differs from that of FIG. 1 in that a light-emitting element 11 is mounted at the bottom of a bowl-shaped cup 46 having a reflective surface (inner peripheral surface) made of a white color resin and having no terraces, and in that light-emitting element 11 is sealed with a transparent resin 42 containing phosphor particles 43, 44 and 45 distributed in a prescribed manner.

For transparent resin 42, it is possible to use epoxy resin, silicone resin or the like. At least two kinds of particles selected from phosphor particles 43 for red light, phosphor particles 44 for green light and phosphor particles 45 for blue light are included in transparent resin 42, and these phosphor particles are distributed as being separated approximately into layers depending on their kinds. Here, the phosphor particles for emitting secondary light of a shorter wavelength are distributed farther from light-emitting element 11.

More specifically, transparent resin 42 includes large size phosphor particles 43, medium size phosphor particles 4, and small size phosphor particles 45, which are separated into layers. In this case, light emitted from the larger size phosphor particles can be scattered by the smaller size phosphor particles, thereby becoming uniform radiation.

The light-emitting device as shown in FIG. 9 can be fabricated in the following manner. As described above, the phosphors contained in transparent resin 42 are those of at least two kinds selected from phosphor particles 43 for red light, phosphor particles 44 for green light and phosphor particles 45 for blue light. The phosphor particles of the different kinds have their particle sizes adjusted such that they differ in settling speed in the transparent resin of a liquid phase before being set.

The settling speed of the phosphor particles in the liquid resin is determined according to the gravity acting on the phosphor particles and the magnitude of friction force due to the liquid resin in contact with the surfaces of the particles. The gravity is proportional to cubic of the particle size, and the friction force is proportional to square of the particle size. Thus, the particle size considerably affects the settling speed of the particles. The friction force due to the liquid resin does not much depends on the kind of resin, but mainly depends on the surface state of the phosphor particle and thus varies depending on the material and the surface treatment of the phosphor.

In the case of the phosphor particles for which no special surface treatment has been performed, the surface area per unit mass is generally greater in the finer particles, of which settling speed is slower than that of the coarser particles (see WO 02/059982 A1). Incidentally, in the case that primary phosphor particles coagulate to form secondary particles, the settling speed is determined not depending on the size of the primary particle but depending on the diameter of the secondary particle. It is considered that the above-described idea generally holds, although the actual phosphor particles are not of an ideal sphere shape and simple comparison cannot be done.

To cause the particles distributed in the liquid resin to be separated depending on their sizes by utilizing the difference in settling speed as described above, it is practically desirable to use phosphor particles of inorganic material having sizes in the order of several µm. For example, if the particle size is decreased to the order of Bohr radius as disclosed in Japanese Patent Laying-Open No. 2004-071357, the separation will take a long time, which is not practical.

In Example 16, it is possible to use the phosphor particles for red, green and blue lights having their respective median sizes of, e.g., 13 µm, 9.5 µm and 6.5 µm. Here, the median size refers to the central value in distribution of the particle size. The averaged particle diameter $d_{50}$ is often used as a parameter indicating the particle size as well. Whether the former or the latter is used, not much influence is caused on the effects of the present invention. Incidentally, it is needless to say that narrower distribution of the particle size in each kind of the phosphors is more preferable from the standpoint of clearer separation between the different kinds of phosphors.

More specifically, referring again to FIG. 9, different kinds of phosphor particles 43, 44 and 45 having different settling speeds are kneaded together into transparent resin 42 of a liquid phase, which is introduced into cup 46 provided with light-emitting element 11. Thereafter, transparent resin 42 containing phosphor particles 43, 44 and 45 is left at rest for a prescribed time period. Then, phosphor particles 43 having a faster settling speed are distributed such that the concentration thereof is higher near the bottom of cup 46 and decreases as the distance from the bottom increases. In contrast, the phosphor particles 45 having a slower settling speed are distributed such that the concentration thereof is lower near the bottom of cup 46 and increases as the distance from the bottom increases. As such, the concentration distribution of the phosphor particles can be formed depending on the settling speeds thereof.

It is noted that the chemical formulae representing the phosphors and composition ratios thereof shown in the above Examples are merely representative, and that the effects of the present invention can be achieved as long as the phosphors satisfy the compositions and composition ratios shown in the "Summary of the Invention" section above.

As described above, the present invention can provide a light-emitting device that includes a wavelength conversion unit containing plural kinds of phosphors for efficiently emitting light in response to the ultraviolet light or blue light emitted from a light-emitting element, in which it is easy to set the color of emission light and it is possible to provides high luminance. Further, it is possible to provide a light-emitting device that can radiate white light excellent in color reproducibility (NTSC ratio).

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A light-emitting device comprising:
a light-emitting element mounted on a hard wiring-board, and
a wavelength conversion unit comprising plural kinds of phosphors different in light absorption characteristic from each other that are dispersed in a single layer of a transparent binder resin, wherein the phosphor particles are settled such that a particular kind of the phosphor having a greater median value of the particle size has a greater concentration near said light-emitting element.

2. A light-emitting device comprising:

a light-emitting element mounted on a bottom surrounded by a reflective surface of an inner wall, and a wavelength conversion unit comprising plural kinds of phosphors different in light absorption characteristic from each other that are dispersed in a single layer of a transparent binder resin, wherein the phosphor particles are settled such that a particular kind of the phosphor having a greater median value of the particle size has a greater concentration near said light-emitting element.

* * * * *